United States Patent [19]
Baxter

[11] Patent Number: 6,018,624
[45] Date of Patent: *Jan. 25, 2000

[54] METHOD TO BACK ANNOTATE PROGRAMMABLE LOGIC DEVICE DESIGN FILES BASED ON TIMING INFORMATION OF A TARGET TECHNOLOGY

[75] Inventor: Glenn A. Baxter, Ben Lomond, Calif.

[73] Assignee: Xilinx, Inc., San Jose, Calif.

[*] Notice: This patent is subject to a terminal disclaimer.

[21] Appl. No.: 09/232,333

[22] Filed: Jan. 15, 1999

Related U.S. Application Data

[62] Division of application No. 08/634,478, Apr. 18, 1996, Pat. No. 5,949,983.

[51] Int. Cl.[7] .................................................. G06F 9/455
[52] U.S. Cl. .............................. 395/500.37; 395/500.17
[58] Field of Search ........................... 395/500.2, 500.04, 395/500.05, 500.06, 500.07, 500.08, 500.17, 500.34, 500.35, 500.36, 500.37, 500.4; 714/726

[56] References Cited

U.S. PATENT DOCUMENTS

| | | | |
|---|---|---|---|
| 5,068,603 | 11/1991 | Mahoney .................................. | 714/726 |
| 5,084,824 | 1/1992 | Lam et al. ................................ | 364/490 |
| 5,182,719 | 1/1993 | Kuroda et al. ........................... | 364/490 |
| 5,224,056 | 6/1993 | Chene et al. ........................ | 395/500.08 |
| 5,452,227 | 9/1995 | Kelsey et al. ............................ | 364/489 |
| 5,452,239 | 9/1995 | Dai et al. ................................. | 364/578 |
| 5,465,216 | 11/1995 | Rotem et al. ............................ | 364/488 |
| 5,475,605 | 12/1995 | Lin ............................................ | 364/488 |
| 5,475,695 | 12/1995 | Caywood et al. ........................ | 371/27 |
| 5,493,507 | 2/1996 | Shinde et al. ............................ | 364/489 |
| 5,497,378 | 3/1996 | Amini et al. ........................... | 371/22.3 |
| 5,510,999 | 4/1996 | Lee et al. ................................. | 364/491 |
| 5,513,124 | 4/1996 | Trimberger et al. ............... | 395/500.08 |
| 5,526,278 | 6/1996 | Powell ..................................... | 364/489 |
| 5,563,801 | 10/1996 | Lee et al. ................................. | 364/491 |
| 5,590,049 | 12/1996 | Arora ....................................... | 364/489 |
| 5,594,657 | 1/1997 | Cantone et al. ......................... | 364/490 |
| 5,703,789 | 12/1997 | Beausang et al. ....................... | 364/489 |
| 5,752,006 | 5/1998 | Baxter ................................. | 395/500.35 |
| 5,870,586 | 2/1999 | Baxter ................................. | 395/500.17 |

Primary Examiner—Kevin J. Teska
Assistant Examiner—Dan Fiul
Attorney, Agent, or Firm—Kent Richardson; Jeanette S. Harms

[57] ABSTRACT

One embodiment of the invention allows a designer to quickly and efficiently obtain a simulation model for a new integrated circuit implementation of a circuit design from the PLD simulation model for that circuit design. The designer begins with the simulation model of the PLD and back annotates the simulation model with timing characteristics from a target technology. The back annotation substitutes timing values in the PLD simulation model with timing values from the target technology to generate the new integrated circuit simulation model.

7 Claims, 6 Drawing Sheets

Figure 4: Example Statistical Mapping of Derived Delays for Two Input Circuit

METHOD TO BACK ANNOTATE PROGRAMMABLE LOGIC DEVICE DESIGN FILES BASED ON TIMING INFORMATION OF A TARGET TECHNOLOGY

RELATED APPLICATION

This application is a divisional of U.S. patent application Ser. No. 08/634,478, now U.S. Pat. No. 5,949,983, entitled "Method to Back Annotate Programmable Logic Device Design Files Based on Timing Information of a Target Technology" filed Apr. 18, 1996, which is incorporated herein by reference.

BACKGROUND OF THE INVENTION

1. Field of the Invention

This invention relates to the field of circuit simulation. In particular, the invention relates to a system and method of simulating a circuit by modifying a programmable logic device representation of that circuit. The modified representation is then used in a simulation of the circuit.

2. Description of Related Art

Programmable logic devices are a class of devices that allow a user to program a device to perform the function of a particular circuit. Examples of programmable logic devices are FPGAs (field programmable gate arrays) and FPLDs (field programmable logic devices).

In some cases, where the economies of scale warrant, a designer will want to target a circuit design for a different implementation technology. That is, a designer will want to convert a circuit design to a technology (e.g., mask programmed integrated circuit technology) other than in a programmable logic device. A Mask Programmed Integrated Circuit (MPIC) version reduces the silicon area needed to implement the circuit design and is therefore less expensive. This conversion process may be to a simple mask programmed version of the PLD, or a totally different representation; but the user logic functionality is maintained. One example of such a process is described in U.S. Pat. No. 5,550,839, entitled, "Mask-Programmed Integrated Circuits Having Timing and Logic Compatibility to User-Configured Logic Arrays," assigned to the assignee of this application.

As part of the process of implementing the circuit design in the target technology, the designer verifies the target technology implementation's operation. The purpose of verifying the implementation's operation is to ensure that implementation's function is equivalent to the function of the programmable logic device's implementation. Ensuring the functionally equivalent operation of the target technology's implementation is exceptionally important. The designer wants to simply replace the programmable logic device with the new integrated circuit. For a straightforward replacement, the new integrated circuit must be a functional equivalent of the programmable logic device's implementation of the circuit design.

One method of verifying the target technology implementation uses simulation tools. A simulation tool simulates a circuit design in a given target technology implementation. For example, to simulate an implementation of a circuit design in an XC4000™ FPGA, available from Xilinx, Inc. of San Jose, Calif., the designer first captures the circuit design using a schematic capture tool such as the ViewDraw™ tool from ViewLogic, Inc. of Milpitas, Calif. The designer then compiles the circuit design into an LCA™ file (Logic Cell Array file) using the XACT Step™ tools, available from Xilinx, Inc. The LCA file describes a physical netlist description of a programmed FPGA that implements the circuit design. The LCA file includes timing characteristics that can be used to simulate the circuit design as implemented in the PLD. The designer then converts the LCA file to an XNF™ file (Xilinx Netlist Format file) using the LCA2XNF™ tool, available from Xilinx, Inc. The XNF file provides a human readable high level design language description of the netlist defined in the LCA file. The XNF file also includes the timing characteristics from the LCA file. The XNF file can now be used as input to a simulator such as the VSS™ simulator, available from Synopsys, Inc. That is, the XNF file represents a simulation model for the FPGA implementation of the circuit design. The resulting FPGA simulation model is used by the designer to test the FPGA's implementation of the circuit design and verify the functionality of the circuit design.

To simulate the same circuit design implemented in an MPIC, the designer first converts the PLD implementation of the circuit design into an MPIC model. The conversion results in a netlist description of the circuit design implemented in the MPIC.

From the netlist description, the designer can partially simulate the MPIC implementation of the circuit design. However, because the netlist has not been placed and routed, it is difficult to guarantee the functional relationships and the timing relationships between the MPIC and the FPGA implementations of the circuit design. To completely simulate the MPIC implementation of the circuit design, the designer first places and routes the netlist. The timing information from the place and route is then used to back annotate the netlist. The back annotated netlist can then be used to simulate the MPIC implementation.

Importantly, generating the MPIC netlist is time consuming. Further, generating the placed and routed MPIC netlist requires substantially more time. Thus, it is desirable to have a faster method of generating a model for simulating the MPIC. It is also desirable to not have to perform the time consuming place and route and back annotation steps to generate a simulation model for the MPIC implementation.

SUMMARY OF THE INVENTION

One embodiment of the invention allows a designer to quickly and efficiently obtain a simulation model for a new integrated circuit implementation of a circuit design from the PLD simulation model for that circuit design. The designer begins with the simulation model of the PLD and back annotates the simulation model with timing characteristics from the target technology. The back annotation substitutes timing values in the PLD simulation model with timing values from the target technology to generate the new integrated circuit simulation model.

In one embodiment, the timing values from the target technology correspond to three types of delays: specification delays, derived delays and net delays. Each of these delays corresponds to various logic elements used to perform desired functions. Although the PLD implements the functions differently than the new integrated circuit, the functions are the same.

The specification delays include delay values for devices that have a direct match between the new integrated circuit target technology and the PLD technology (e.g., delays for a flip-flop that is instantiated in both the PLD and new integrated implementations of a circuit design). In one embodiment, the specification delays are not included and are replaced by derived delays.

The derived delays are statistically derived delay values of functional blocks implemented in a specific technology.

The net delays are delay values of nets. The net delays for the new integrated circuit are determined in a number of ways including statistical modeling, approximation equations, and direct calculation.

Note that the three types of delays are generated from the target technology and not for the specific implementation of the circuit design in the new integrated circuit.

The new integrated circuit simulation model is generated quickly and efficiently because it is derived directly from the PLD simulation model and timing values relating to the target technology and not necessarily from the specific implementation in the new integrated circuit.

BRIEF DESCRIPTION OF THE FIGURES

The figures illustrate the invention by way of example, and not limitation. Like references indicate similar elements.

DETAILED DESCRIPTION
MPIC Generation from a PLD

Figure 1:
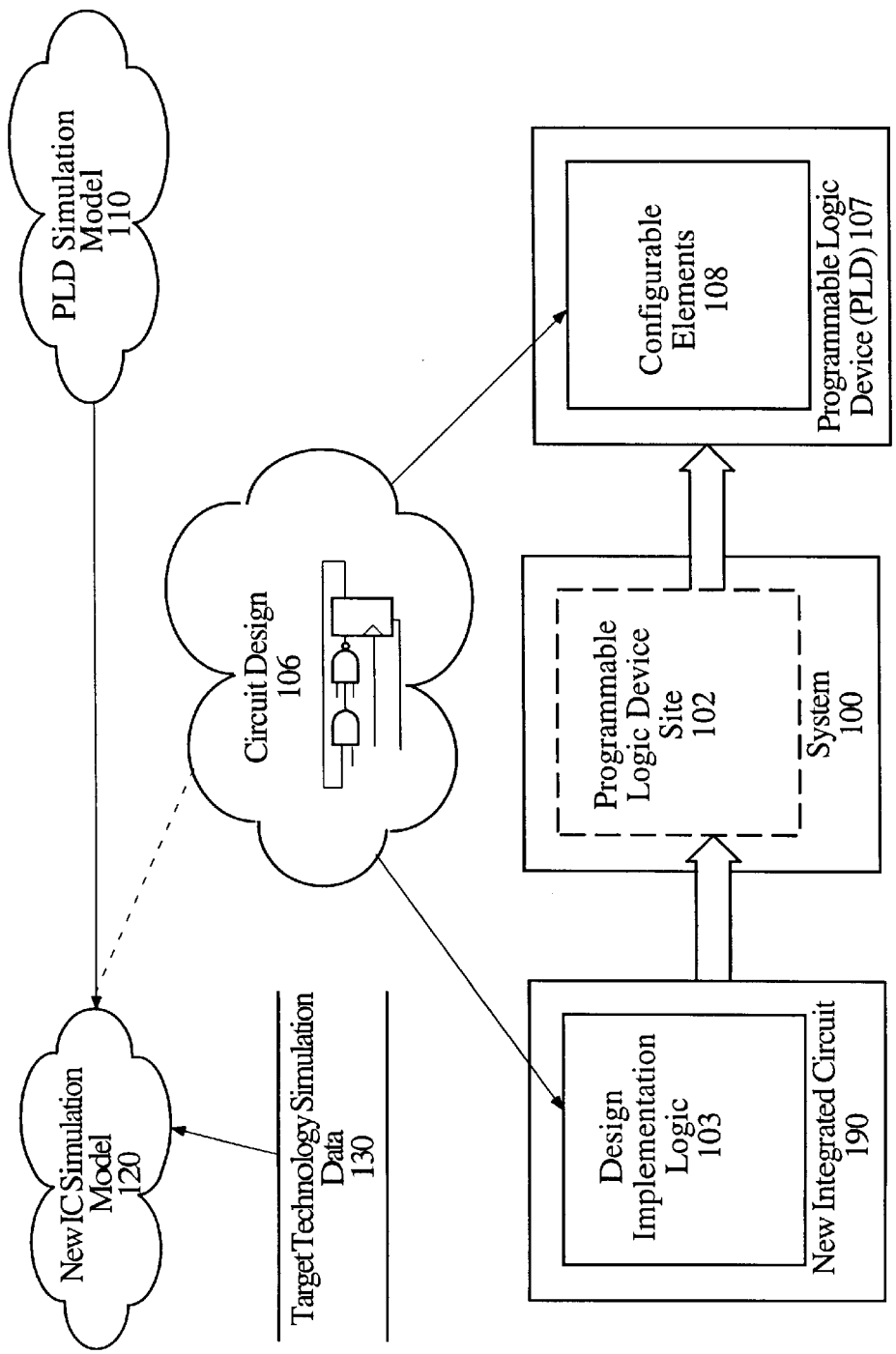
FIG. 1 illustrates a system where a new integrated circuit implementation of a circuit design has been substituted for a PLD and where a simulation model for the MPIC is generated from a PLD simulation model.

Prior to discussing the various types of delays, the generation of a new integrated circuit from a PLD implementation of a circuit design 106 and the generation of a new integrated circuit simulation model from a PLD simulation model are described. FIG. 1 illustrates a system where a new integrated circuit 190 implementation of a circuit design 106 has been substituted for a PLD 107 and where a new integrated circuit simulation model 120 is generated from a PLD simulation model 110.

FIG. 1 includes a circuit design 106, a system 100 having a programmable logic device site 102, a programmable logic device 107 and a new integrated circuit 190. From the circuit design 106, a PLD simulation model 110 is generated. Advantageously, using the PLD simulation model 110 and some target technology simulation data 130, a new IC simulation model 120 is generated.

The circuit design 106 includes a description of a circuit. In one embodiment, a designer captures the circuit design 106 using a software tool. ViewLogic, Inc. of Milpitas, Calif. supplies such software tools, for example, the View-Draw™ tool. In one embodiment, the circuit design includes an HDL (Hardware Design Language) description of a circuit, such as a Verilog, VHDL or netlist description. Using software tools, the PLD 107 is programmed to perform the functions of the circuit design 106.

The PLD 107, in one embodiment, includes a FPGA (Field Programmable Gate Array), such as, an XC4000™ series FPGA, available from Xilinx, Inc.

The PLD simulation model 110, in one embodiment, includes information for simulating the circuit design 106 as the circuit design 106 is implemented in the PLD 107. In one embodiment, the PLD simulation model 110 includes a netlist description of the circuit design 106 as the circuit design 106 is implemented in the PLD 107 and timing information. In one embodiment, the PLD simulation model 110 includes an XNF (Xilinx Netlist Format) file. (The XNF file was generated from an LCA file. The XNF file is a hierarchical netlist description of the information from the LCA file. An LCA2XNF™ software tool, also from Xilinx, Inc., converts an LCA file to the XNF file.) The XNF file includes a netlist description of a programmed PLD that implements the circuit design 106 and the timing information of the elements in the netlist.

Table 1 illustrates a portion of a PLD simulation model 110 (an example XNF file) for a circuit design 106. The timing information for each element is shown in bold. For example, the timing information for the PIN, F1, NET1 element is 2.9 ns.

TABLE 1

```
LCANET, 5
PROG, ICA2XNF, 5.0.0, "COMMAND=-defmc pld TIME=Wed Apr 17 13:58:47 1996"
PART, 4003PC84-4
USER, AREA, 2
USER, ADJUST, 0.5, 4.0
SYM, MY_FUNCTION, CLB, LIBVER=2.0.0, BLKNM=MY_FUNCTION, LOC=BB
   CFG, Equate H=(H1*F)+(~H1*G)
   CFG, Equate G=((~(G1*G2))+(~(G3*G4)))
   CFG, Equate F=((~(F1*F2))+(∞(F3*F4)))
   CFG, Config F4: G2: G3: X: Y:H XQ: YQ: FFX:RESET FFY:RESET DX: DY:
        F:F1:F2:F3:F4 G:G1:G2:G3:G4 H:F:G:H1 H1:C1 DIN: SR: EC: RAM:
        CARRY: CIN: COUT: CDIR:
   CFG, Base FG
   PIN, Y, O, FUNCTION_OUT
   PIN, F1, I, NET1, 2.9
   PIN, F2, I, NET2, 2.4
   PIN, F3, I, NET3, 1.4
   PIN, F4, I, NET4, 1.8
   PIN, G1, I, NET5, 1.8
   PIN, G2, I, NET6, 1.3
   PIN, G3, I, NET7, 2.8
   PIN, G4, I, NET8, 2.5
   PIN, C1, I, NET9, 1.8
```

TABLE 1-continued

```
MODEL
   SYM, FUNCTION_OUT, EQN, LIBVER=2.0.0, EQN=(I0*I1)+(~I0*I2)
      PIN, O, O, FUNCTION_OUT, 2.0
      PIN, I2, I, MY_FUNCTION.G
      PIN, I1, I, MY_FUNCTION.F
      PIN, I0, I, NET9, 4.3
   END
   SYM, MY_FUNCTION.G, EQN, LIBVR=2.0.0, EQN=((~(I0*I1))+(~(I2*I3)))
      PIN, O, O, MY_FUNCTION.G, 4.0
      PIN, I3, I, NET8, 2.5
      PIN, I2, I, NET7, 2.8
      PIN, I1, I, NET6, 1.3
      PIN, I0, I, NET5, 1.8
   END
   SYM, MY_FUNCTION.F, EQN, LIBVER=2.0.0, EQN=((~(I0*I1))+(~(I2*I3)))
      PIN, O, O, MY_FUNCTION.F, 4.O
      PIN, I3, I, NET4, 1.8
      PIN, I2, I, NET3, 1.4
      PIN, I1, I, NET2, 2.4
      PIN, I0, I, NET1, 2.9
   END
 ENDMOD
END
SYM, MY_FF, CLB, LIBVER=2.0.0, BLKNM=MY_FF, LOC=LL
   CFG, Equate G=G1
   CFG; Config F4: G2: G3: X: Y: XQ:QX YQ: FFX:K:RESET FFY:RESET DX:G DY: F:
      G:G1 H: H1: DIN: SR: EC: RAM: CARRY: CIN: COUT: CDIR:
   CFG, Base FG
   PIN, XQ, O, FF_OUT
   PIN, G1, I, FUNCTION_OUT, 8.9
   PIN, K, I, MY_CLK, 2.8
   MODEL
      SYM, MY_FF.G, BUF, LIBVER=2.0.0
         PIN, I, I, FUNCTION_OUT, 8.9
         PIN, O, O, MY_FF.G, 4.0
      END
      SYM, FF_OUT, DFF, LIBVER=2.0.0, INIT=R
         PIN, Q, O, FF_OUT, 3.0
         PIN, D, I, MY_FF.G
         PIN, C, I, MY_CLK, 2.8
         PULSE, C, +, 4.0
         SETUP, D, C, +, 0.5, 4.0
      END
   ENDMOD
END
```

The new integrated circuit 190, created from a description of a circuit design 106 in the PLD 107, is substituted for that PLD 107 in the system 100. The new integrated circuit 190 mounts directly into the programmable logic device site 102. The PLD 107 includes a number of configurable elements 108 that are programmed to perform the functions of the circuit design 106. The new integrated circuit 190 includes design implementation logic 103 that also implements the functions of the circuit design 106. However, the new integrated circuit 190 implements the functions of the circuit design 106 as those functions are implemented in the PLD 107. This high degree of compatibility is an important feature because the user need not redesign the system 100 when the new integrated circuit 190 is substituted for the PLD 107.

Importantly, the fabrication technology used to fabricate the new integrated circuit 190 affects the speed of the circuits in the new integrated circuit 190. That is, even though all of the circuit design 106, as implemented in the PLD 107, has been completely defined in the design implementation logic 103, the speed of the new integrated circuit 190 may be significantly different. These speed differences may result in malfunctions because of races and other timing related problems. Thus, one embodiment of the invention generates a new simulation model 120 quickly and efficiently, allowing a designer to verify that the new integrated circuit 190 will work properly.

The new integrated circuit simulation model 120 is generated directly from the PLD simulation model 110 by back annotating the PLD simulation model 110 with the target technology simulation data 130. Specifically, the timing values in the PLD simulation model 110 are replaced with timing values for the target technology. Thus, to generate the new integrated circuit simulation model 120, the designer need only access the PLD simulation model 110 and the target technology simulation data 130.

Generating an MPIC Simulation Model

Figure 2:
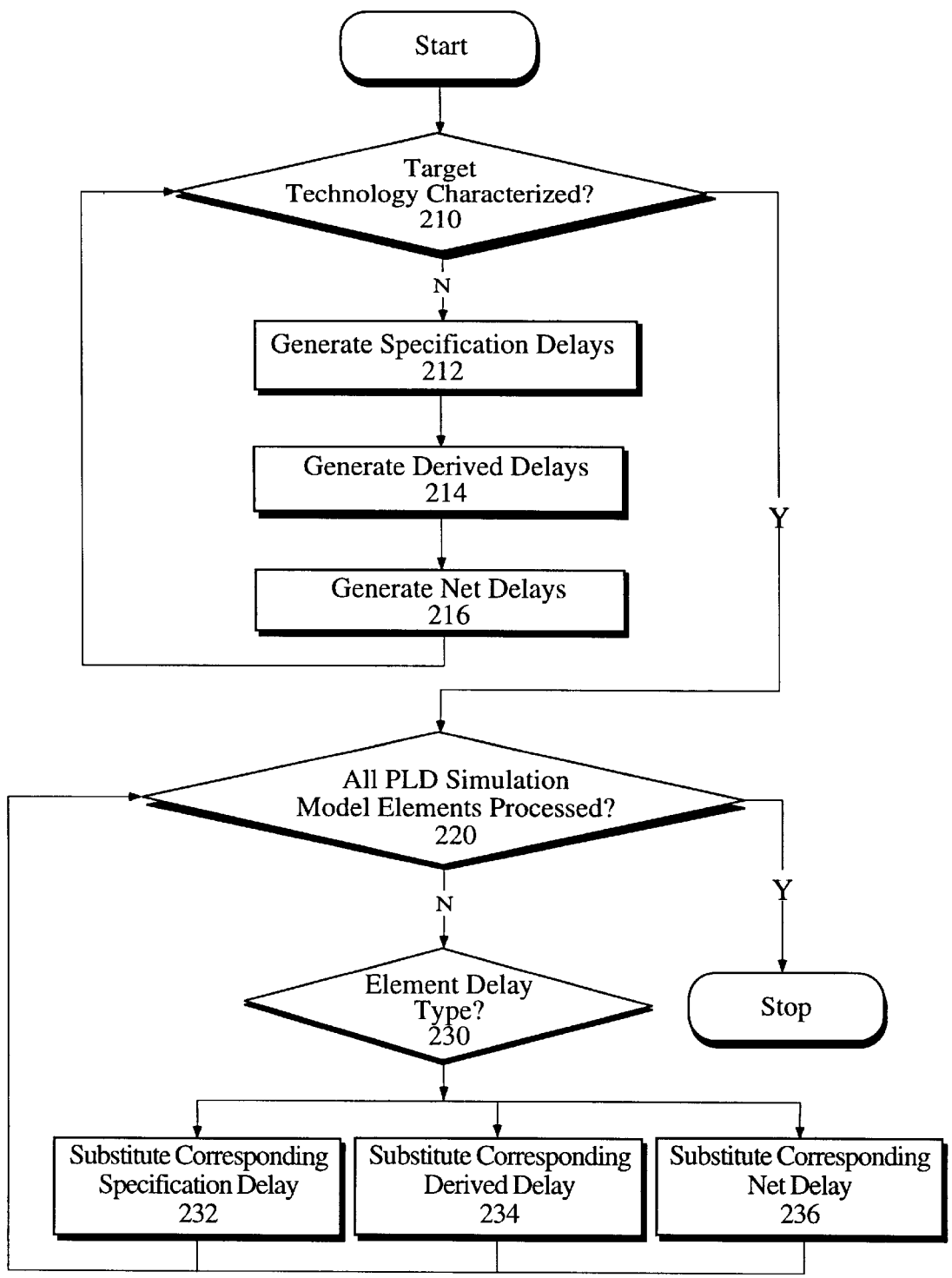
FIG. 2 illustrates generating a simulation model of an MPIC from a PLD simulation model.

FIG. 2 illustrates generating a new integrated circuit model 120 from a PLD simulation model 110. The embodiment shown in FIG. 2 is implemented using one or more computers. Different embodiments of the invention execute the steps of FIG. 2 in different orders. For example, step 212 is executed after step 214 in one embodiment, while in another embodiment, these steps are performed in parallel.

The generation process can be thought of as two distinct parts: the technology characterization and generating the integrated circuit model 120. The technology characterization determines a set of delay values that correspond to delay values in a PLD simulation model 110. Importantly, the target technology characterization need only be done once for each fabrication technology. The technology characterization process is described in step 210 through step 216. Generating the integrated circuit model 120 is described in the step 220 through step 236. At step 210, a test is made to determine whether the target fabrication technology has been characterized. If previously characterized, then step 212 through step 216 need not be performed. At step 212, the specification delays for the target technology are generated. The specification delays are delay values for devices that have a direct match between the new integrated circuit target technology and the PLD technology (e.g., delays for a flip-flop that is instantiated in both the PLD and new integrated implementations of a circuit design). At step 214, the derived delays for the target technology are generated. In one embodiment, the derived delays are statistically derived delay values of functional blocks implemented in the target technology. At step 216, the net delays for the target technology are generated. The net delays are delay values of nets in the target technology. The specification delays, the derived delays and the net delays are described in greater detail below.

In one embodiment, the specification delays, the derived delays and the net delays are stored in the target technology simulation data 130. After the target technology is completely characterized, the new integrated circuit simulation model 120 is generated from the PLD simulation model 110. At step 220, a test is made to determine whether all of the elements in the PLD simulation model 110 have been executed. If not, then the next element in the PLD simulation model 110 is processed by step 230 through step 236. At step 230, the type of delay corresponding to the next element in the PLD simulation model 110 is determined. For example, if the element is a flip-flop, then delay type is a specification delay. If the element is a net, then the delay type is a net delay.

Step 232 is performed if the delay type is a specification delay. At step 232, the specification delay, from the target technology simulation data 130, for the element type is accessed. The specification delay is then substituted for the delay in the PLD simulation model 110 for that element. That is, the PLD simulation model 110 is back annotated with the specification delay. In one embodiment, at step 232, the element in the XNF file is edited by replacing the delay value for the element as implemented in the PLD with the specification delay.

Step 234 is performed if the delay type is a derived delay. Step 236 is performed if the delay type is a net delay. Step 234 and step 236 are performed in the same way as step 232 except that a derived delay and a net delay, respectively, are used.

Thus, the result of step 210 through step 236, in one embodiment, is a back annotated XNF file. Table 2 illustrates a back annotated version of the XNF file of Table 1. The new timing information is shown in bold.

TABLE 2

LCANET, 5
PROG, HWXNFBA, 1.0, "COMMAND=–ba pld mpic TIME=Wed Apr 17 14:24:54 1996"
PART, 4003PC84-4
USER, AREA, 2
USER, ADJUST, 0.5, 4.0
SYM, MY_FUNCTION, CLB, LIBVER=2.0.0, BLKNM=MY_FUNCTION, LOC=BB
   CFG, Equate H=(H1*F)+(~H1*G)
   CFG, Equate G=((~(G1*G2))+(~(G3*G4)))
   CFG, Equate F=((~(F1*F2))+($\infty$(F3*F4)))
   CFG, Config F4: G2: G3: X: Y:H XQ: YQ: FFX:RESET FFY:RESET DX: DY:
       F:F1:F2:F3:F4 G:G1:G2:G3:G4 H:F:G:H1 H1:C1 DIN: SR: EC: RAM:
       CARRY: CIN: COUT: CDIR:
   CFG, Base FG
   PIN, Y, O, FUNCTION_OUT
   PIN, F1, I, NET1, 2.5
   PIN, F2, I, NET2, 2.1
   PIN, F3, I, NET3, 1.2
   PIN, F4, I, NET4, 1.6
   PIN, G1, I, NET5, 1.6
   PIN, G2, I, NET6, 1.1
   PIN, G3, I, NET7, 2.4
   PIN, G4, I, NET8, 2.2
   PIN, C1, I, NET9, 1.6
   MODEL
      SYM, FUNCTION_OUT, EQN, LIBVER=2.0.0, EQN=(I0*I1)+(~I0*I2)
         PIN, O, O, FUNCTION_OUT, 1.8
         PIN, I2, I, MY_FUNCTION.G
         PIN, I1, I, MY_FUNCTION.F
         PIN, I0, I, NET9, 3.6
      END
      SYM, MY_FUNCTION.G, EQN, LIBVR=2.0.0, EQN=((~(I0*I1))+(~(I2*I3)))
         PIN, O, O, MY_FUNCTION.G, 3.5
         PIN, I3, I, NET8, 2.2
         PIN, I2, I, NET7, 2.4
         PIN, I1, I, NET6, 1.1
         PIN, I0, I, NET5, 1.6
      END
      SYM, MY_FUNCTION.F, EQN, LIBVER=2.0.0, EQN=((~(I0*I1))+(~(I2*I3)))
         PIN, O, O, MY_FUNCTION.F, 3.5
         PIN, I3, I, NET4, 1.6
         PIN, I2, I, NET3, 1.2

TABLE 2-continued

```
      PIN, I1, I, NET2, 2.1
      PIN, I0, I, NET1, 2.5
   END
  ENDMOD
END
SYM, MY_FF, CLB, LIBVER=2.0.0, BLKNM=MY_FF, LOC=LL
  CFG, Equate G=G1
  CFG; Config F4: G2: G3: X: Y: XQ:QX YQ: FFX:K:RESET FFY:RESET DX:G DY: F:
      G:G1 H: H1: DIN: SR: EC: RAM: CARRY: CIN: COUT: CDIR:
  CFG, Base FG
  PIN, XQ, O, FF_OUT
  PIN, G1, I, FUNCTION_OUT, 3.2
  PIN, K, I, MY_CLK, 2.7
  MODEL
     SYM, MY_FF.G, BUF, LIBVER=2.0.0
       PIN, I, I, FUNCTION_OUT, 3.2
       PIN, O, O, MY_FF.G, 3.2
     END
     SYM, FF_OUT, DFF, LIBVER=2.0.0, INIT=R
       PIN, Q, O, FF_OUT, 2.2
       PIN, D, I, MY_FF.G
       PIN, C, I, MY_CLK, 2.7
       PULSE, C, +, 3.2
       SETUP, D, C, +, 0.5, 2.0
     END
  ENDMOD
END
```

After the new integrated circuit simulation model 120 is generated, the designer can simulate the function of the new integrated circuit 190. The designer can run static timing analysis tools on the new integrated circuit simulation model 120 to identify race conditions or other potential timing problems, caused by the new fabrication technology.

Another advantage of one embodiment is that because the new integrated circuit simulation model 120 is an XNF file with different delay values, the same tools used to simulate the PLD simulation model 110 can be used on the new integrated circuit simulation model 120.

Delay Types

Figure 3:
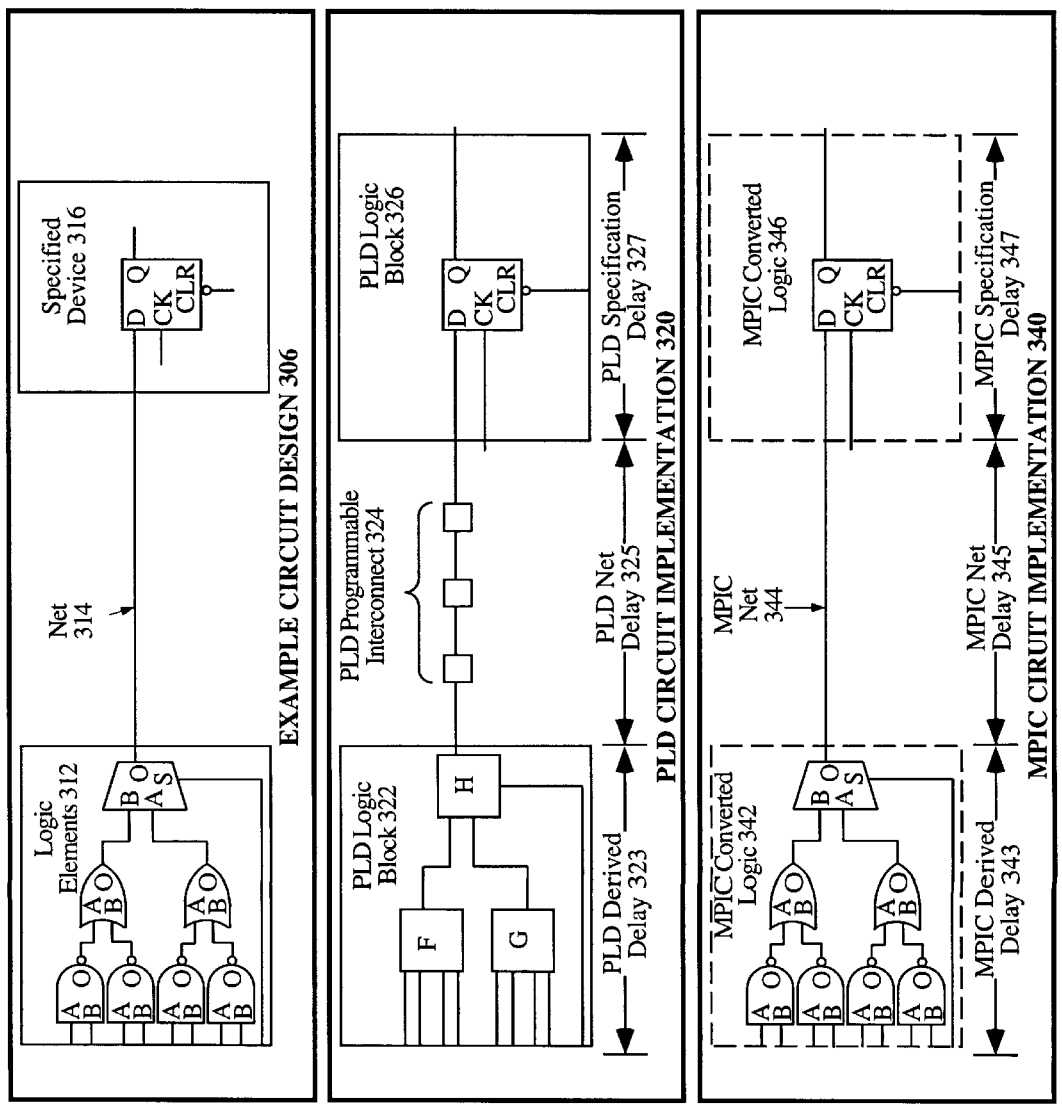
FIG. 3 illustrates different types of delays that are mapped from the PLD simulation model to the a new integrated circuit simulation model.

FIG. 3 illustrates different types of delays that are mapped from the PLD simulation model 110 to the new integrated circuit simulation model 120. In the example of FIG. 3, the new integrated circuit 190 includes an MPIC (Mask Programmed Integrated Circuit).

FIG. 3 includes an example circuit design 306, a PLD circuit implementation 320, and an MPIC circuit implementation 340. The example circuit design 306 includes a number of logical elements 312 that perform a function, a net 314 and a specified device 316. The net 314 connects the output of the logical elements 312 to the specified device 316.

The PLD circuit implementation 320 includes: a PLD logic block 322, a PLD programmable interconnect 324 and a PLD logic block 326. The PLD logic block 322, the PLD programmable interconnect 324 and the PLD logic block 326 are part of the configurable elements 108. The PLD logic block 322 implements the function of the logical elements 312. Similarly, the PLD logic block 326 implements the function of the specified device 316. The PLD programmable interconnect 324 corresponds to the net 314. The PLD programmable interconnect 324 connects the PLD logic block 322 output to the PLD logic block 326 input.

The PLD circuit implementation 320, in this example, shows the example circuit design 306 as implemented in an XC4000™ series FPGA. In this embodiment, the PLD logic block 322 includes a CLB (Configurable Logic Block) having F, G, and H functional units that, when programmed, implement the function of the logic elements 312. The PLD logic block 326 includes a CLB that, when programmed, uses a D flip-flop to implement the function of the specified device 316. The PLD programmable interconnect 324 includes a number of wire connections and PIPs (Programmable Interconnect Points) that, when programmed, connect the output of the first CLB to the input of the second CLB.

Each of the elements in the PLD circuit implementation 320 corresponds to a different type of delay. The PLD logic block 322 corresponds to a derived delay 323. The PLD programmable interconnect 324 corresponds to a PLD net delay 325. The PLD logic block 326 corresponds to the PLD specification delay 327.

The MPIC circuit implementation 340 includes: a MPIC converted logic 342, a MPIC net 344 and a MPIC converted logic 346. The MPIC converted logic 342, the MPIC net 344 and the MPIC converted logic 346 are included in the design implementation logic 103. The MPIC converted logic 342 implements the function of the logical elements 312 as implemented by the PLD logic block 322. The MPIC converted logic 346 implements the function of the specified device 316 as implemented by the PLD logic block 324. The MPIC net 344 is a net between the two MPIC converted logic blocks and performs the same function as the PLD programmable interconnect 324 in that the MPIC net 344 communicates the output signal for the logic elements 312, implemented in the MPIC converted logic 342, to the input signal for the specified device 316, implemented in the MPIC converted logic 346.

Each of the elements in the MPIC circuit implementation 340 corresponds to a different type of delay. Importantly, each of the MPIC delays has a direct correspondence with a PLD delay. In the example of FIG. 3, the MPIC converted logic 343 corresponds to the PLD derived delay 323. The MPIC net delay 345 corresponds to the PLD net delay 325. The MPIC specification delay 347 corresponds to the PLD specification 327. To determine the timing of the elements in the MPIC circuit implementation 340, one embodiment of the invention determines the relationships for the different types of delays.

Specification Delays

As noted above, the specification delays are delay values for devices that have a direct match between the new integrated circuit target technology and the PLD technology (e.g., delays for a flip-flop that is instantiated in both the PLD and new integrated implementations of a circuit design). Thus, in step 212, the specification delays are determined for the target technology by first matching devices in the target technology that will be instantiated in the new integrated circuit 190 with devices in the PLD.

For example, consider the case of the specified device 316. The specified device 316 is implemented by the PLD logic block 326 in the PLD. The flip-flop in the PLD logic block 326 has the following timing characteristics:

| Parameter | PLD (ns) | MPIC (ns) |
|---|---|---|
| Tco - Clock to output delay | 3.0 | 2.9 |
| Tdsu - Data to clock setup time | 4.5 | 1.8 |
| Th - Data in hold time | 0.0 | 1.2 |
| Trdsu - RD to clock setup time | 8.0 | 3.0 |
| Trdw - Minimum width of the RD to be recognized | 4.0 | 2.2 |
| Tcw - Minimum width of C to be recognized | 9.0 | 4.8 |
| Tgsrw - Minimum width of GSR to be recognized | 18.0 | 4.0 |

Each of the PLD parameters has an equivalent parameter in the target technology (the MPIC fabrication technology in this case). The invention takes advantage of the correspondence between parameters so that each time a specified device occurs in the XNF file, the MPIC timing value is substituted.

In one embodiment, these specification delays are taken directly from the data sheets for the target technology. Where the equivalent parameter is vaguely defined, the parameter is determined from the target technology models, available from the manufacturer.

In one embodiment, the specification delays are replaced with derived delays. That is, no specification delays are used. Derived delays can be used to replace the specification delays because all of the specification delays can also be derived.

Derived Delays

The derived delays are delay values of functional blocks implemented in a specific technology. The functional blocks perform logic functions given a predetermined number of inputs. For example, given the three inputs A, B and C, a functional block will produce Z, where Z is AB+~A~BC. A derived delay value for Z is then determined for the functional block based upon the delay incurred in a target technology implementation of the functional block. In one embodiment, the derived delay is assigned to the inputs of the functional block (e.g., A, B and C), thereby compensating for any differences between the propagation times of the input signals to the output.

Importantly, in one embodiment, the derived delay value does not correspond to the actual logic function performed by the functional block, but does correspond to the number of inputs to the functional block. Thus, statistical analysis is performed to determine the average delay of a functional block having a specific number of inputs implemented in a specific technology. Maximum and minimum delay values are also determined, in one embodiment.

The following example illustrates a statistically determined delay for a two input XOR gate implemented in an MPIC. The derived delay corresponds to the time required for a signal to pass from the input pins to the output pin, as implemented in the target technology. This time is accurately measured from the back annotated functional blocks, as compiled using the target technology. Such back annotated functional blocks are generated, in one embodiment, from HDL descriptions of the functional blocks using the Synopsys design compiler™, available from Synopsys, Inc., of Mountain View, Calif., and the target technology design library. The compiled designs are placed and routed, with a software tool such as GateEnsemble™, from Cadence Design Systems, Inc., of Milpitas, Calif., and timing information is back annotated into the compiled designs. This timing information is the exact derived delay for that target technology implementation of a specific logic function. Once the exact derived delays for enough two input functional blocks are determined, a statistical model can be generated that accurately represents the total delay for any two input functional block implemented in the target technology. To characterize the entire target technology, this technique is then repeated for the function blocks having other numbers of inputs (e.g., 1, 2, 3 and 4 input functional blocks having a signal pass from pin Fn to pin X or Y).

Returning to FIG. 3, the derived delay time for the MPIC derived delay 343 is the statistically determined delay for a nine input functional block as implemented in the target technology.

Figure 4:
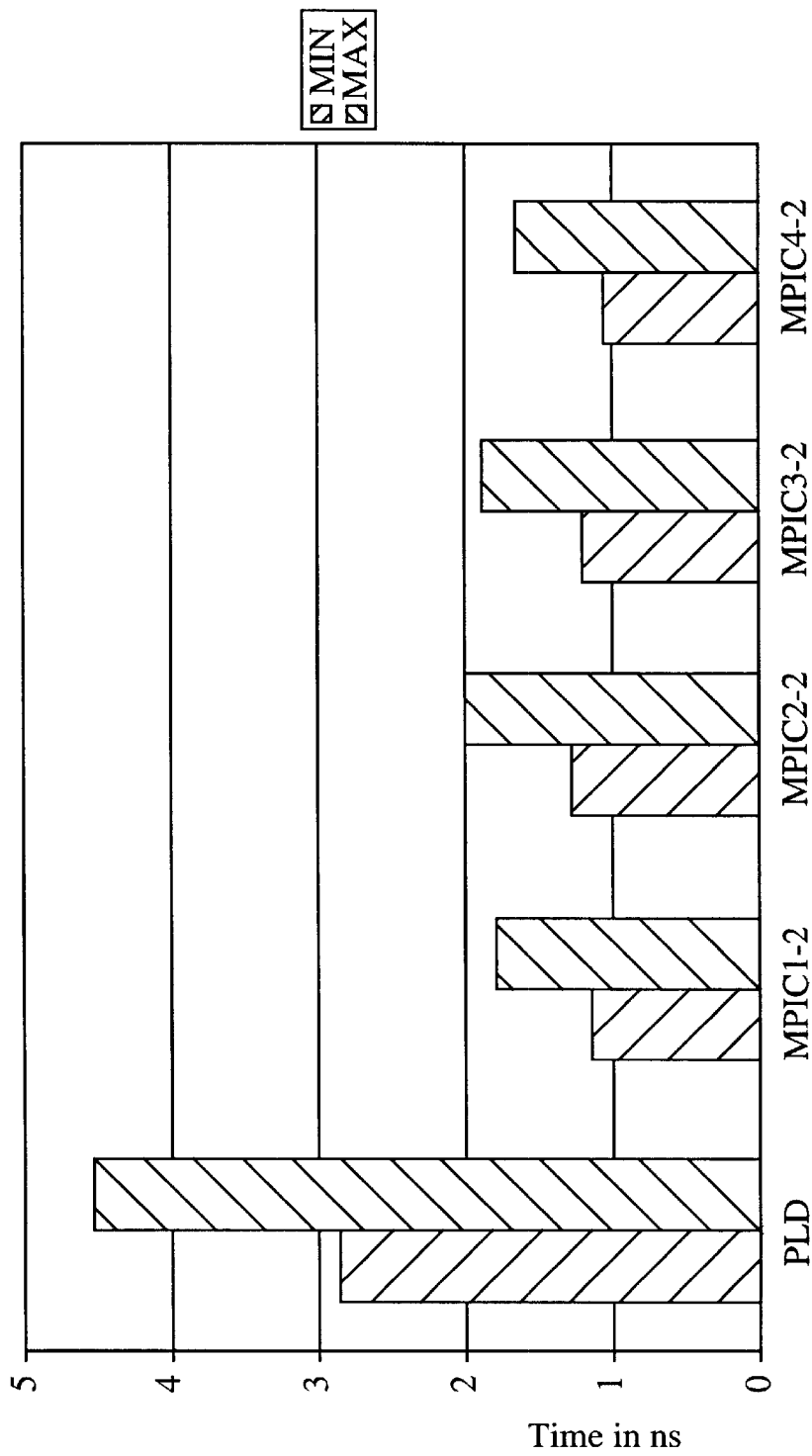
FIG. 4 illustrates a derived delay statistical map.

FIG. 4 illustrates a statistical comparison of derived delays for any two input functional blocks for a PLD, and four different MPIC two input functional blocks, as implemented in a target technology. Minimum and maximum times are determined for each of the implementation technologies. If the data of FIG. 4 were used in the steps of FIG. 2, the step 234 substitutes the 4.5 ns two input PLD derived delay value with the statistical average of the derived delay value for the MPIC two input function blocks (e.g., 1.8 ns).

Net Delays

The net delays are pure wiring delays, i.e. delays associated with transmitting a signal from a source to a destination. The net delays for the new integrated circuit are determined in a number of ways including statistical modeling, approximation equations, and direct calculation.

Before discussing the net delays in the target technology, the following information on net delays in the PLD simulation model 110 is provided. In one embodiment, the nets in the PLD 107 are modeled as an RC (Resistance and Capacitance) tree that treats the net as distributed R and C. The R and C of the net are used to determine the net delays. Net delays, in the XNF file, are placed at the inputs of the destination CLBs, rather than at the output of the signals, thereby allowing the same net to have different delay values that correspond to the various parts of the R and C in the tree. To characterize the target process, corresponding net delays are determined.

Importantly, one embodiment of the invention assumes that relative net lengths will not change when implementing the PLD 107 implementation of the circuit design 106 in the new integrated circuit 190. That is, because elements in the design implementation logic 103 will be placed relative to each other in the same pattern as the configurable elements 108, the net lengths will remain relatively the same. For example, if one 1000 um long net in the PLD 107 corresponds to a 100 um net in the new integrated circuit 190, then all of the 1000 um nets in the PLD will correspond to nets that are approximately 100 um.

In one embodiment, statistical analysis is used to determine the net delays for the target technology. To determine the net delays for a target technology, the delays for different lengths of nets are determined using the back annotation process described for determining the derived delays. These lengths of nets are then correlated with their corresponding net delay in the PLD to generate a statistical correlation between different lengths of nets in the two technologies. For example, assume that the exact net delay for the MPIC net 344 is 4 ns and the exact net delay for the PLD programmable interconnect 324 is 11 ns, then these two value are correlated. After enough nets of different lengths have been correlated, a relationship between different length nets in the PLD 107 and new integrated circuit 190 is determined.

Figure 5:
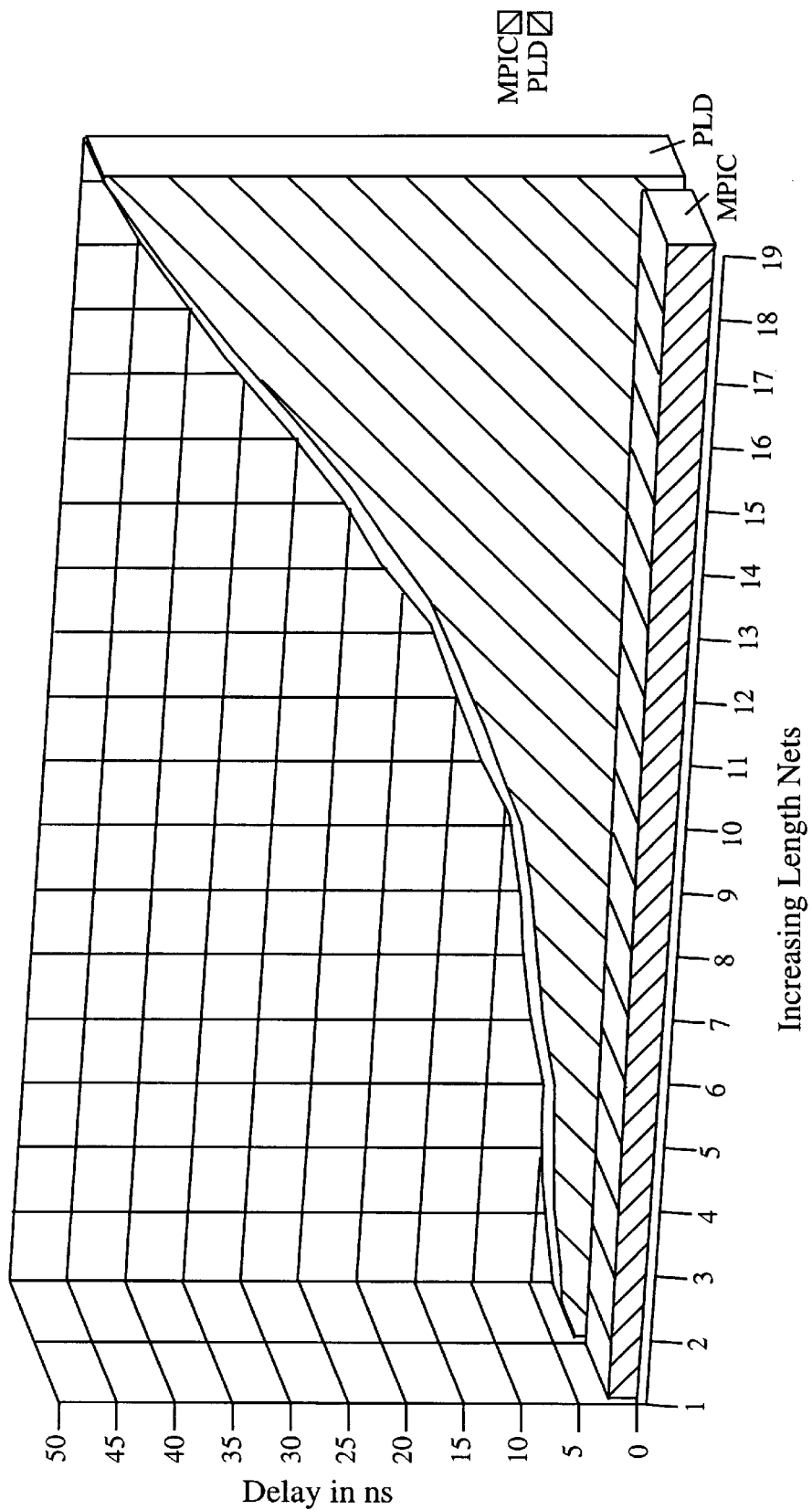
FIG. 5 illustrates a net delay comparison.

FIG. 5 illustrates the correlated net delays for a PLD and an MPIC technology. Note that as the net length in the PLD becomes longer, the net delay increases significantly because routing the longer nets requires more PIPS, thereby resulting in much larger R and C values. Also note that the MPIC has a much more linear relationship, since all of its nets are implemented as wire only, and do not require PIPs for connection. Using the information of FIG. 5, if, at step 326, the net delay is 35 ns in an XNF file, then the net delay value substituted into the new integrated circuit model 120 is 4 ns.

Because the lengths of the nets are correlated between the two technologies, no placing and routing need be done to generate the new integrated circuit simulation model 120. Removing the need to place and route greatly reduces the amount of time required to generate the new integrated circuit simulation model 120.

Importantly, in one embodiment, guardband (an amount of time such as 0.1 ns) is added to (subtracted from) the maximum (minimum) delay values (specification, net and/or derived) to ensure the greatest possible error tolerance for the delay value. In one embodiment, the guardbands are only added to statistically derived delay values.

Figure 6:
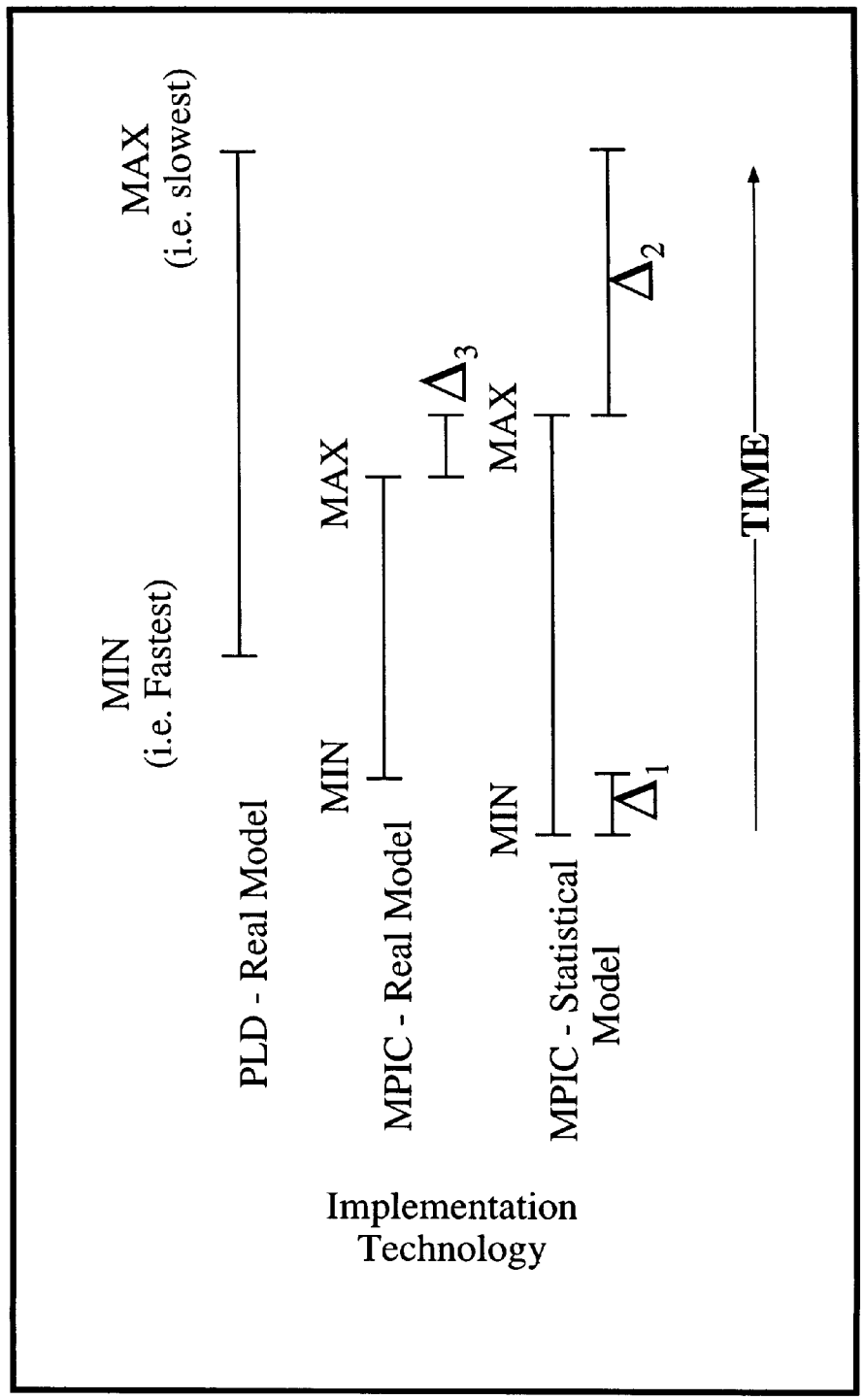
FIG. 6 illustrates a comparison between actual timing characteristics of a PLD and a new integrated circuit, and the timing characteristics derived for a new integrated circuit simulation model.

In conclusion, the present invention allows a designer to quickly and efficiently check to determine whether a circuit design 106 implementation in a new integrated circuit 190 will perform as that circuit design 106 performed when implemented in the PLD 107. FIG. 6 shows that a designer can rely upon the method described herein to ensure proper operation of the new integrated circuit 190.

FIG. 6 illustrates a comparison between the actual timing characteristics of a PLD and a MPIC, and the timing characteristics for an example new integrated circuit simulation model 120 for that MPIC. The far right pole for each technology represents the maximum delay (i.e. slowest) operation of the device. The far left pole for each technology represents the minimum delay (i.e. fastest) operation of the device.

FIG. 6 shows three deltas: delta 1, delta 2, and delta 3. Each delta represents a distinct time difference between the actual timing characteristics and the new integrated circuit simulation model 120. Delta 1 shows that the new integrated circuit simulation model 120 guarantees a better sampling of hazard conditions because the model has a faster minimum time than does the actual MPIC technology. Thus, delta 1 acts as a guardband to ensure that the new integrated circuit 190 will not operate faster than the new integrated circuit simulation model 120 defines. Delta 2 shows the guaranteed performance increase of the new integrated circuit 190 over the PLD 107. Since the maximum pole of the new integrated circuit simulation model 120 is less than the actual PLD pole, a performance improvement can be guaranteed to be at least Delta 2. Delta 3 guarantees that the worst case maximum delay values are used to determine timing errors or hazardous operational conditions of the new integrated circuit 190. Additionally, the designer can expect some additional performance improvements (Delta 2 plus Delta 3), but since Delta 3 is so much smaller than Delta 2, the performance gained is not that significant. Note that all of this information can be quickly obtained by back annotating the PLD simulation model 110 using the target technology simulation data 130.

To guarantee the operation of both the PLD 107 and the MPIC in the system 100, the PLD simulation model 110 is simulated using the maximum PLD delay values, and the new integrated circuit simulation model 120 is simulated using the minimum MPIC statistical model delay values. By comparing the results of the two simulations, and ensuring that no functional differences exist, the operation of both devices is guaranteed across all process, temperature and power variations. Importantly, if faster operation is required in the system 100, then only the MPIC can be used. For the faster operation, the MPIC statistical model maximum pole determines the slowest speed of the MPIC. By comparing the results of the minimum MPIC statistical model simulation against the maximum MPIC statistical model simulation, and verifying that no function differences exist, the faster operation is guaranteed.

The above description is presented for the purpose of illustration. The description does not limit the invention to the precise embodiments disclosed. The claims define the scope of the invention.

What is claimed is:

1. A method of verifying an operation of a mask programmed integrated circuit (MPIC) implementation of a programmable logic device (PLD) implementation of a circuit design using a computer system, said method comprising:

generating a PLD simulation model of said circuit design as implemented in a PLD;

back annotating said PLD simulation model using timing information corresponding to said MPIC implementation to generate an MPIC simulation model; and verifying said operation by simulating said MPIC simulation model.

2. The method of claim 1 further including characterizing a fabrication technology used to fabricate an MPIC to generate said timing information corresponding to said MPIC implementation.

3. The method of claim 2 wherein said characterizing said fabrication technology includes:

determining a set of specification delay values, where a specification delay value corresponds to a delay value of an electronic device implemented in said fabrication technology.

4. The method of claim 2 wherein said characterizing said fabrication technology includes:

determining a set of derived delay values, where a derived delay value corresponds to a circuit implemented in said fabrication technology which performs a function corresponding to a portion of said circuit design.

5. The method of claim 2 wherein said characterizing said fabrication technology includes:

determining a set of net delay values, where a net delay value corresponds to a delay of a length of interconnect implemented in said fabrication technology.

6. The method of claim 1 wherein back annotating said PLD simulation model includes, for each element defined in said PLD simulation model, identifying a delay value for said each element, determining a type of delay value corresponding to said each element, and replacing said delay value for said each element with a corresponding type of delay value from said timing information corresponding to said MPIC implementation.

7. The method of claim 1 wherein said simulating includes performing a static timing analysis on said MPIC simulation model.

* * * * *